(12) United States Patent
Gomm et al.

(10) Patent No.: US 9,124,253 B2
(45) Date of Patent: Sep. 1, 2015

(54) METHODS AND APPARATUSES FOR DUTY CYCLE PRESERVATION

(71) Applicant: Micron Technology, Inc., Boise, ID (US)

(72) Inventors: Tyler J. Gomm, Boise, ID (US); Yasuo Satoh, Tsukuba (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/058,092

(22) Filed: Oct. 18, 2013

(65) Prior Publication Data

US 2015/0109036 A1 Apr. 23, 2015

(51) Int. Cl.
*H03L 5/00* (2006.01)
*H03K 3/017* (2006.01)
*H03L 7/06* (2006.01)
*H03K 5/156* (2006.01)

(52) U.S. Cl.
CPC .............. *H03K 3/017* (2013.01); *H03K 5/1565* (2013.01); *H03L 7/06* (2013.01)

(58) Field of Classification Search
USPC .......... 327/141, 144–163, 355–361; 331/1 A, 331/15–17; 375/373–376
See application file for complete search history.

(56) References Cited

U.S. PATENT DOCUMENTS

| | | | |
|---|---|---|---|
| 6,445,231 B1 * | 9/2002 | Baker et al. | 327/158 |
| 6,650,160 B2 * | 11/2003 | Tanahashi | 327/277 |
| 6,667,646 B2 * | 12/2003 | Gailhard et al. | 327/281 |
| 6,853,225 B2 | 2/2005 | Lee | |
| 6,856,170 B2 * | 2/2005 | Itoh | 326/93 |
| 7,057,431 B2 * | 6/2006 | Kwak | 327/158 |
| 7,120,839 B2 | 10/2006 | Fayneh et al. | |
| 7,199,634 B2 * | 4/2007 | Cho et al. | 327/175 |
| 7,237,136 B2 | 6/2007 | Li et al. | |
| 7,579,890 B2 | 8/2009 | Sohn | |
| 7,915,934 B2 | 3/2011 | Ku | |
| 7,940,103 B2 | 5/2011 | Satoh et al. | |
| 8,143,928 B2 * | 3/2012 | Satoh et al. | 327/175 |
| 8,436,655 B2 * | 5/2013 | Kurita et al. | 326/68 |
| 8,466,726 B2 | 6/2013 | Satoh et al. | |
| 2005/0017783 A1 * | 1/2005 | Lee et al. | 327/333 |
| 2006/0103446 A1 * | 5/2006 | Brox et al. | 327/333 |
| 2008/0036517 A1 | 2/2008 | Huang et al. | |
| 2008/0169853 A1 | 7/2008 | Park et al. | |
| 2010/0225372 A1 | 9/2010 | Satoh et al. | |
| 2011/0204948 A1 | 8/2011 | Satoh et al. | |
| 2013/0051166 A1 | 2/2013 | Ma et al. | |
| 2013/0135017 A1 * | 5/2013 | Jones et al. | 327/142 |
| 2013/0241619 A1 * | 9/2013 | Ma et al. | 327/276 |
| 2013/0249612 A1 * | 9/2013 | Zerbe et al. | 327/161 |

* cited by examiner

*Primary Examiner* — Brandon S Cole
(74) *Attorney, Agent, or Firm* — Dorsey & Whitney LLP

(57) ABSTRACT

Methods and apparatuses are disclosed for preserving duty cycle at voltage domain boundaries. One example apparatus includes a complement generation circuit configured to generate a complementary signal responsive to an input signal. The complement generation circuit is configured to operate in a first voltage domain. The apparatus also includes a compensation circuit configured to generate a compensated signal by compensating the input signal for a delay corresponding to the complement generation circuit. The compensation circuit is configured to operate in a second voltage domain. The apparatus also includes a phase mixing circuit configured to combine the complementary signal and the compensated signal to generate an output signal.

28 Claims, 5 Drawing Sheets

METHODS AND APPARATUSES FOR DUTY CYCLE PRESERVATION

BACKGROUND OF THE INVENTION

When an integrated circuit includes multiple voltage domains, where the voltage domains have respective voltage source potentials, the boundaries between the different voltage domains can pose challenges. For example, with regard to a signal path, when a clock signal propagating through the signal path crosses from one voltage domain to another, the duty cycle of the clock signal can be distorted as a result of downstream circuitry included in the signal path switching on and off at different voltages than upstream circuitry due to the different voltage source potentials between the different voltage domains. For example, the timing for transitioning a signal between different clock levels (e.g., from a low clock level to a high clock level or from a high clock level to a low clock level) may be different for the two different voltage domains. As a result, the different transition times may cause the duty cycle of the signal to lengthen or shorten as the signal crosses between two voltage domains. Also, if the clock signal is crossing from a lower voltage domain into a higher voltage domain, a level translator may be required to fully drive the downstream circuitry. The level translator may further distort the clock signal's duty cycle.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
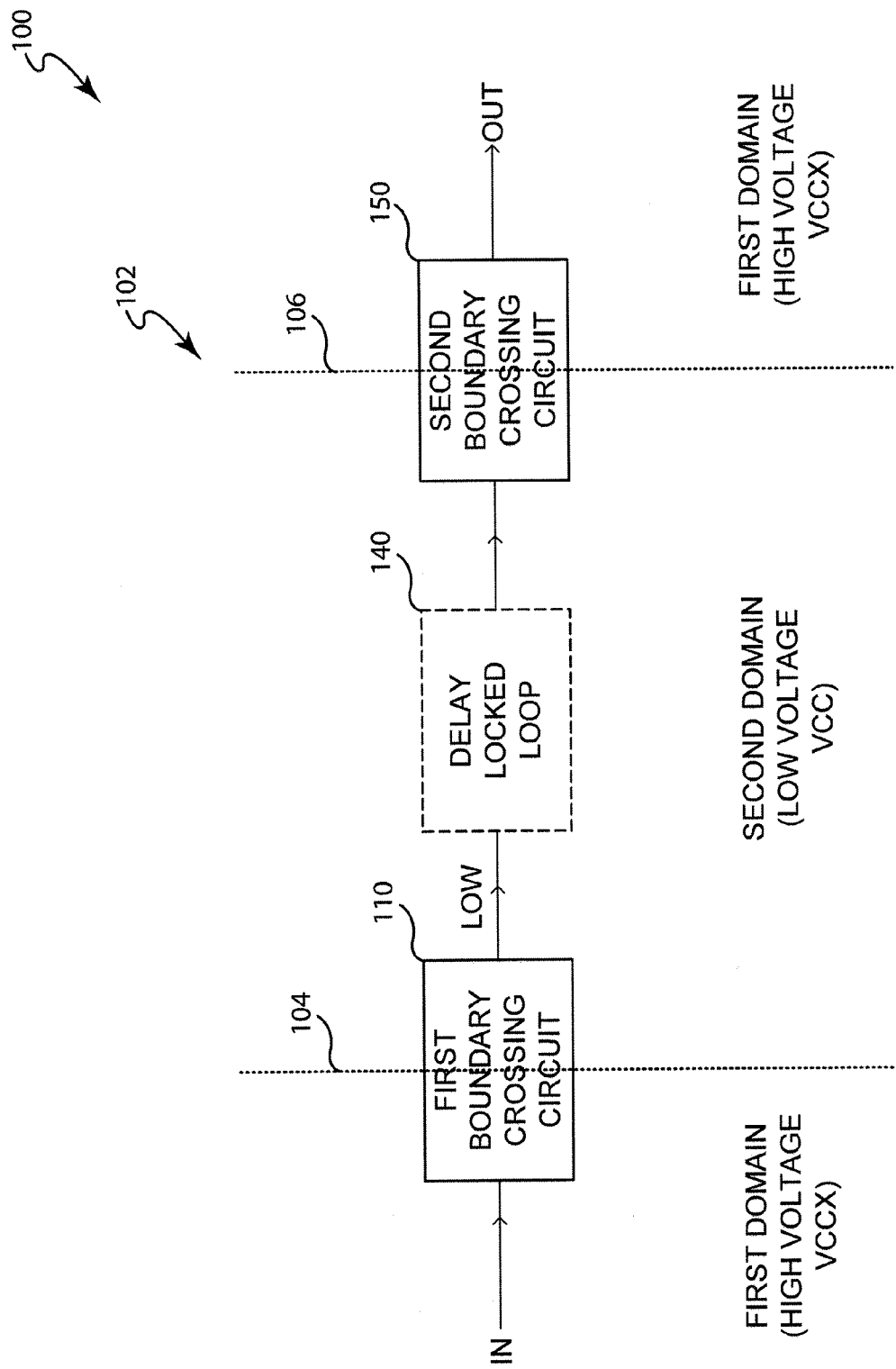
FIG. 1 is a block diagram of an apparatus with a signal path that preserves duty cycle at voltage domain boundaries according to an embodiment of the present invention.

FIG. 1 illustrates an apparatus 100 with a signal path 102 that preserves duty cycle at voltage domain boundaries, according to an embodiment of the invention. As used herein, apparatus may refer to, for example, an integrated circuit, a memory device, a memory system, an electronic device or system, a smart phone, a tablet, a computer, a server, etc. As illustrated in FIG. 1, signal path 102 passes through two different voltage domains. The first voltage domain has a voltage potential that is higher than the second voltage domain, and will be referred to as a "high voltage domain," and the circuitry in the high voltage domain is powered by a first voltage source operating at a first voltage potential VCCX, which may be 1.8 volts, for example. The second voltage domain will be referred to as a "low voltage domain," and the circuitry in the low voltage domain is powered by a second voltage source operating at a second voltage potential VCC, which is less than the first voltage potential VCCX. The second voltage potential VCC may be 1.2 volts, for example. In some embodiments, the second voltage domain may be a regulated voltage domain. The second voltage domain may be regulated in order to reduce power supply sensitivity of circuitry operating in the second voltage domain.

A first boundary crossing circuit 110 is coupled between the first voltage domain and the second voltage domain at a first boundary 104 on the signal path 102. A second boundary crossing circuit 150 is coupled between the second voltage domain and the first voltage domain at a second boundary 106 on the signal path 102. In some examples, the signal path 102 may be a forward clock path, and the signal propagating through the signal path 102 may be a clock signal. In these examples, a delay locked loop 140 (or, alternatively, a phase locked loop) may be included in the signal path 102 and coupled between the first and second boundary crossing circuits 110, 150 of the signal path 102, and may be configured to operate in the second (lower) voltage domain. In some embodiments, a boundary crossing circuit may be coupled between the first or second voltage domains and a third voltage domain and having a voltage that is different than the voltages of the first and second voltage domains.

Each of the boundary crossing circuits 110, 150 may be configured to preserve duty cycle at their respective boundaries 104, 106. The first boundary crossing circuit 110, for example, may preserve duty cycle across the first boundary 104 by inverting an input signal IN in the first voltage domain, delaying the input signal IN in the second voltage domain, and combining the inverted input signal and the delayed input signal in the second voltage domain in order to generate an output signal LOW, as described below in more detail with reference to FIGS. 2A through 2C. The output signal LOW, in the second voltage domain, may correspond with the input signal IN, in the first voltage domain, and the output signal LOW may have a duty cycle that is substantially similar to the duty cycle of the input signal IN as a result of the first boundary crossing circuit 110.

Similarly, the second boundary crossing circuit 150 may preserve duty cycle across the second boundary 106 by inverting its input signal (e.g., LOW, or in some cases the output of the delay locked loop 140) in the second voltage domain, delaying that input signal in the first voltage domain, and combining the inverted input signal and the delayed input signal in the first voltage domain in order to generate its output signal OUT, as described below in more detail with references to FIGS. 3A through 3C. The output signal OUT, in the first voltage domain, may correspond with the input signal LOW, in the second voltage domain, and the output signal OUT may have a duty cycle that is substantially similar to the duty cycle of the LOW signal as a result of the second boundary crossing circuit 150. In this manner, even though the signal path 102 crosses two different voltage boundaries 104, 106, the duty cycle of a signal, such as a clock signal, propagating through the signal path 102 may be preserved so that the output signal OUT has a duty cycle substantially similar to the duty cycle of the input signal IN.

Figure 2A:
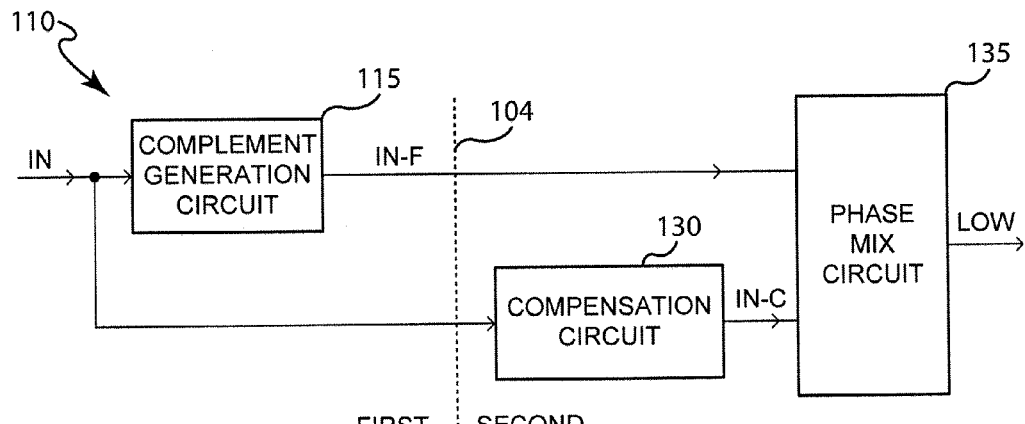
FIG. 2A is a block diagram of a boundary crossing circuit according to an embodiment of the present invention.

FIG. 2A illustrates one embodiment of a boundary crossing circuit 110 that may be used for the first boundary crossing circuit 110 of FIG. 1. The boundary crossing circuit 110 illustrated in FIG. 2A includes a complement generation circuit 115, a compensation circuit 130, and a phase mix circuit 135. The complement generation circuit 115 receives an input signal IN, and is configured to generate a complementary signal IN-F responsive to the input signal IN. In some embodiments, the complement generation circuit 115 may generate the complementary signal IN-F by inverting the input signal IN. The complement generation circuit 115 is configured to operate in the first (higher) voltage domain, and may thus be powered by a first voltage source associated with the first (higher) voltage domain. In some embodiments, the complement generation circuit 115 may provide a partial or "poor man's" phase split. The phase split is only a partial phase split because the complement generation circuit 115 introduces a delay (e.g., phase shift, skew) in the complementary signal IN-F as compared to the input signal IN.

The complementary signal IN-F crosses the first boundary 104 into the second (lower) voltage domain after it is generated by the complement generation circuit 115. The input signal IN also crosses the first boundary 104 into the second (lower) voltage domain before it is provided to the compensation circuit 13Q, which operates in the second (lower) voltage domain. As the complementary signal IN-F and the input signal IN cross the first boundary 104 and/or as these signals propagate through to the downstream circuitry on their respective paths, the duty cycles of these signals may be distorted. However, because the signal IN-F is complementary to the input signal IN, the duty cycle distortion of the complementary signal IN-F may be equivalent to, but in an opposite direction from, the duty cycle distortion of the input signal IN. So, for example, if the duty cycle of the input signal IN lengthens (i.e., the pulse width increases), then the duty cycle of the complementary signal IN-F may get shorter (i.e., the pulse width decreases) by an equivalent magnitude. As a more specific example, if the duty cycle of the input signal IN lengthens by 1%, then the duty cycle of the complementary signal IN-F may shorten by 1%. In general, when one of the signals IN, IN-F is distorted in one direction by crossing the first boundary 104, the other signal may be distorted equivalently in the other direction.

Returning to FIG. 2A, the compensation circuit 130 in FIG. 2A receives the input signal IN, and is configured to generate a compensated signal IN-C by compensating the input signal for a delay corresponding to the complement generation circuit 115. In some embodiments, the compensation circuit 13Q may generate the compensated signal IN-C by delaying the input signal based on the delay (e.g., a phase shift, skew, etc.) introduced to the complementary signal IN-F by the complement generation circuit 115. So, for example, if the complement generation circuit 115 delays the input signal IN by 50 picoseconds in generating the complementary signal IN-F, the compensation circuit 130 may similarly delay the input signal IN by 50 picoseconds in generating the compensated signal IN-C. The delay may be introduced by passing the input signal IN through a delay element, such as an inverter or a buffer, which may or may not invert the signal at the same time as the delay is introduced. The compensation circuit 130 is configured to operate in the second (lower) voltage domain, and thus may be powered by a second voltage source, which is different than the first voltage source. As mentioned above, the second voltage source may operate at a voltage potential VCC that is less than the voltage potential VCCX at which the first voltage source operates.

The phase mix circuit 135 in FIG. 2A receives the complementary signal IN-F as well as the compensated signal IN-C (both of which may have some duty cycle distortion), and is configured to combine the complementary signal IN-F and the compensated signal IN-C in order to generate an output signal LOW. In some embodiments, the phase mix circuit 135 may generate the output signal LOW by phase mixing the complementary signal IN-F and the compensated signal IN-C. Because the complementary signal IN-F and the input signal IN-C were previously distorted in equivalent but opposite directions, and because the input signal IN has been compensated for the delay introduced by the complement generation circuitry, by phase mixing the complementary signal IN-F and the compensated input signal IN-C, the phase mix circuit may effectively remove the equivalent but opposite duty cycle distortions as it generates the output signal LOW. The distortion may be removed because the phase mixing averages the different duty cycle distortions caused along the different paths, thus resulting in reduced duty cycle distortion.

Figure 2B:
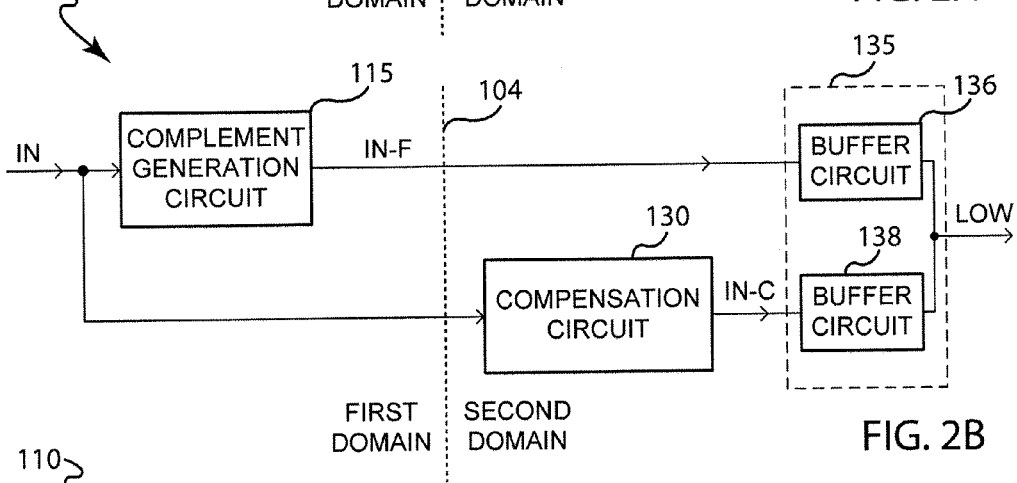
FIG. 2B is a block diagram of a boundary crossing circuit according to an embodiment of the present invention.

FIG. 2B also illustrates an embodiment of a boundary crossing circuit 110 that may be used for the first boundary crossing circuit 110 of FIG. 1 to cross the first boundary 104 between the first and second voltage domains. Like the boundary crossing circuit 110 illustrated in FIG. 2A, the boundary crossing circuit 110 illustrated in FIG. 2B includes a complement generation circuit 115, a compensation circuit 130, and a phase mix circuit 135. The phase mix circuit 135 illustrated in FIG. 2B further includes two buffer circuits 136, 138. The first buffer circuit 136 is configured to receive and buffer the complementary signal IN-F from the complement generation circuit 115 in the second (lower) voltage domain. Similarly, the second buffer circuit 138 is configured to receive and buffer the compensated signal IN-C from the compensation circuit 130 in the second (lower) voltage domain. The first and second buffer circuits 136, 138 may equivalently buffer their respective signals in some embodiments—in other words, they may equivalently drive their respective outputs responsive to their respective inputs. The boundary crossing circuit 110 in effect branches into two different paths within the first boundary—with the complement generation circuit 115 and the first buffer circuit 136 together defining a first path, and the compensation circuit 130 and the second buffer circuit 138 together defining a second path, with the first path being parallel to the second path.

The outputs of the first and second buffer circuits 136, 138 are coupled together and coupled to an output node in order to generate the output signal LOW. Coupling together of the outputs of the first and second buffer circuits 136, 138 may thus effectuate a phase mix of the outputs of the first and second buffer circuits 136, 138. As mentioned above, the first and second buffer circuits 136, 138 may equivalently drive their respective outputs, and in these embodiments, the complementary signal IN-F and the compensated signal IN-C may be equally weighted in the phase mixing. For example, with reference to FIG. 2C, this equal weighting may be accomplished if inverters of equal size are used as the first and second buffer circuits 136, 138.

Figure 2C:
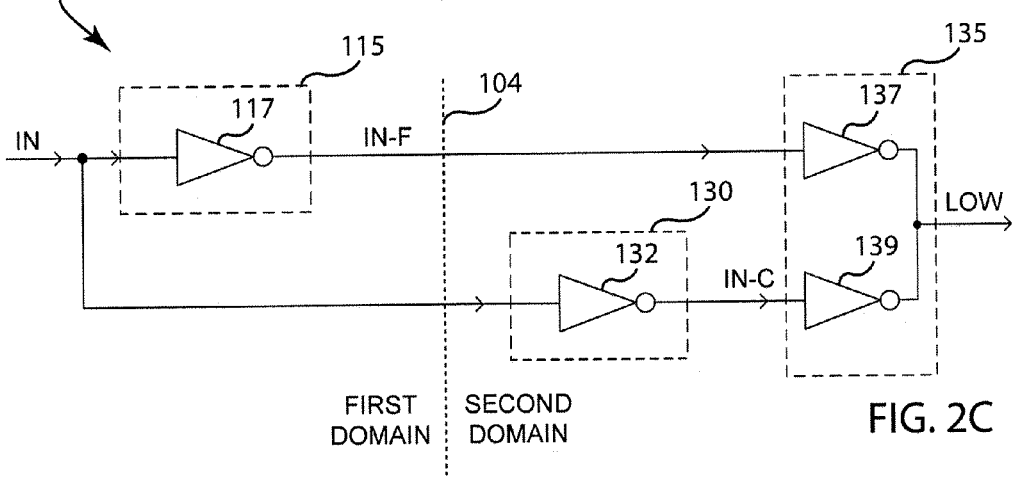
FIG. 2C is a simplified schematic diagram of a boundary crossing circuit according to an embodiment of the present invention.

FIG. 2C also illustrates an embodiment of a boundary crossing circuit 110 that may be used for the first boundary crossing circuit 110 of FIG. 1 to cross the first boundary 104 between the first and second voltage domains. Like the boundary crossing circuit 110 illustrated in FIG. 2A, and the boundary crossing circuit 110 illustrated in FIG. 2B, the boundary crossing circuit 110 illustrated in FIG. 2C includes a complement generation circuit 115, a compensation circuit 130, and a phase mix circuit 135. As illustrated in FIG. 2C, the complement generation circuit 115 may include a first inverter 117, and the compensation circuit 130 may include a second inverter 132. Even though the first inverter 117 operates in the first (higher) voltage domain and the second inverter 132 operates in the second (lower) voltage domain, the first and second inverters 117, 132 may be similarly structured in some embodiments—for example, they may be identically sized, may have the same threshold voltage, may have the same W/L ratio, and so forth. In other embodiments, however, the first and second inverters 117, 132 may be differently structured—for example, the second inverter 132 may be sized to be larger than the first inverter 117 in order to counteract the anticipated slower response of the second inverter 132 as a result of the second inverter 132 operating in the second (lower) voltage domain as compared to the first inverter 117, which operates in the first (higher) voltage domain.

Still with reference to FIG. 2C, the phase mix circuit 135 may include a third inverter 137 coupled to the output of the second inverter 117, which corresponds to the first buffer circuit 136 in FIG. 2B. The phase mix circuit 135 also may include a fourth inverter 139 coupled to the output of the second inverter 132, which corresponds to the second buffer circuit 138 in FIG. 2B. The third and fourth inverters 137, 139 may both operate in the second (lower) voltage domain, and may be similarly structured in some embodiments in order to equivalently buffer and phase mix the complementary signal IN-F and the compensated input signal IN-C. For example, the third and fourth inverters 137, 139 may be identically sized, may have similar threshold voltages, and so forth.

As illustrated in FIG. 2C, some embodiments of the first voltage boundary crossing circuit 110 may introduce only two gates worth of delay into the signal path 102, thus reducing the delay through the first voltage boundary crossing circuit as compared to some other approaches. Because the embodiment illustrated in FIG. 2C only includes four inverter gates, it may also consume less power and take up less area than other approaches. In other embodiments, however, more or fewer gates may be used—the configuration illustrated in FIG. 2C is merely one embodiment.

Figure 3A:
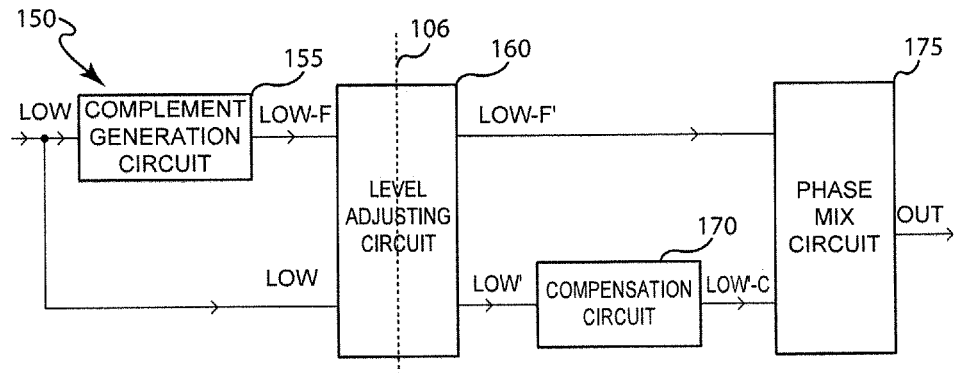
FIG. 3A is a block diagram of a boundary crossing circuit according to an embodiment of the present invention.

FIG. 3A illustrates one embodiment of a boundary crossing circuit 150 that may be used for the second boundary crossing circuit 150 of FIG. 1 in order to cross the second boundary 106 between the second and first voltage domains. The boundary crossing circuit 150 illustrated in FIG. 3A includes a complement generation circuit 155, a compensation circuit 170, and a phase mix circuit 175. The complement generation circuit 155 receives an input signal LOW, and is configured to generate a complementary signal LOW-F responsive to the input signal LOW. In some embodiments, the complement generation circuit 155 may generate the complementary signal LOW-F by inverting the input signal LOW. The complement generation circuit 155 is configured to operate in the second (lower) voltage domain, and may thus be powered by a voltage source associated with the second (lower) voltage domain. In some embodiments the complement generation circuit 155 provides a partial or "poor man's" phase split. The phase split is only a partial phase split because the complement generation circuit 155 introduces a delay (e.g., phase shift, skew) in the complementary signal LOW-F as compared to the input signal LOW.

The boundary crossing circuit 150 in FIG. 3A also includes a level adjusting circuit 160 that is coupled to the output of the complement generation circuit 155 and is configured to receive the complementary signal LOW-F and the input signal LOW. The level adjusting circuit 160 may be configured to adjust (e.g., translate) the voltage levels of the signals LOW, LOW-F as they cross into a higher voltage domain, in order to fully drive the downstream circuitry in the higher voltage domain. The level adjusting circuit may thus generate a translated complementary signal LOW-F' responsive to the complementary signal LOW-F, and may also generate a translated input signal LOW' responsive to the input signal LOW.

As illustrated in FIG. 3A, the complementary signal LOW-F crosses the second boundary 106, within the level adjusting circuit 160, into the first (higher) voltage domain after it is generated by the complement generation circuit 155, and is provided to the phase mix circuit 175 as the translated complementary signal LOW-F'. The input signal LOW also crosses the second boundary 106 into the first (higher) voltage domain within the level adjusting circuit 160, before it is provided to the compensation circuit 170 as the translated input signal LOW'. As these signals cross the second boundary 106 and/or as these signals propagate through to the downstream circuitry on their respective paths, their duty cycles may be distorted, as described above with reference to FIG. 2A. However, because of the boundary crossing circuit 150, the duty cycle distortion of the translated complementary signal LOW-F' may be equivalent to, but in an opposite direction from, the duty cycle distortion of the translated input signal LOW'-C, as also described above. This may be even more so as the level adjusting circuit 160 may further distort the duty cycles of the respective signals.

Still referring to FIG. 3A, the compensation circuit 170 in FIG. 3A receives the translated input signal LOW', and is configured to generate a compensated signal LOW'-C by compensating the translated input signal LOW' for a delay corresponding to the complement generation circuit 155. In some embodiments, the compensation circuit 170 may generate the compensated signal LOW'-C by delaying the input signal based on the delay (e.g., a phase shift, skew, etc.) introduced to the complementary signal LOW-F by the complement generation circuit 155. So, for example, if the complement generation circuit 155 delays the input signal LOW by 50 picoseconds in generating the complementary signal LOW-F, the compensation circuit 170 may similarly delay the translated input signal LOW' by 50 picoseconds in generating the compensated signal LOW'-C. The delay may be introduced by passing the translated input signal LOW' through a delay element, such as an inverter or a buffer, which may or may not invert the signal at the same time as the delay is introduced. The compensation circuit 170 is configured to operate in the first (higher) voltage domain, and thus may be powered by a voltage source associated with the first (higher) voltage domain. The first (higher) voltage source may operate at a voltage potential VCCX that is greater than the voltage potential VCC at which the second (lower) voltage source operates.

The phase mix circuit 175 in the embodiment of FIG. 3A receives the translated complementary signal LOW-F' as well as the compensated signal LOW'-C (both of which may have some duty cycle distortion), and is configured to combine the translated complementary signal LOW-F' and the compensated signal LOW'-C in order to generate an output signal OUT. In some embodiments, the phase mix circuit 175 may generate the output signal OUT by phase mixing the translated complementary signal LOW-F' and the compensated signal LOW'-C. Because the complementary signal LOW-F and the input signal LOW were previously distorted in equivalent but opposite directions, and because the translated input signal LOW' has been compensated for the delay introduced by the complement generation circuitry 155, by phase mixing the translated complementary signal LOW-F' and the compensated signal LOW'-C, the phase mix circuit 175 may effectively remove the equivalent but opposite duty cycle distortions as it generates the output signal OUT. The distortion may be removed because the phase mixing averages the different duty cycle distortions caused along the different paths, thus resulting in little to no duty cycle distortion.

Figure 3B:
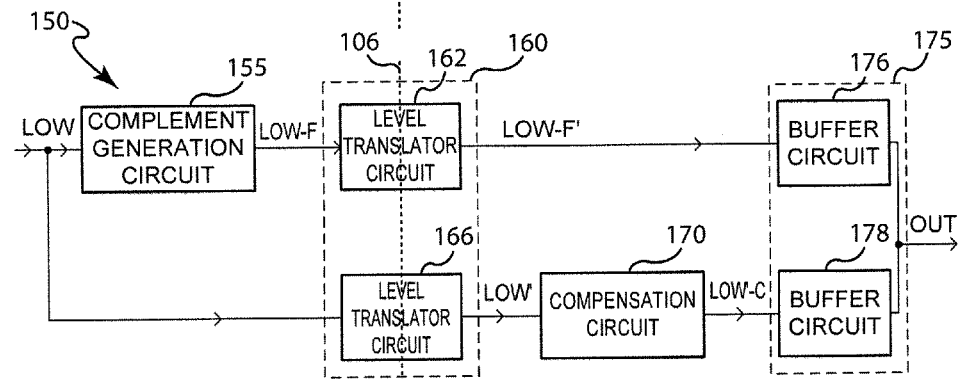
FIG. 3B is a block diagram of a boundary crossing circuit according to an embodiment of the present invention.

FIG. 3B also illustrates an embodiment of a boundary crossing circuit 150 that may be used for the second boundary crossing circuit 150 of FIG. 1 to cross the second boundary 106 between the second and first voltage domains. Like the boundary crossing circuit 150 illustrated in FIG. 3A, the boundary crossing circuit 150 illustrated in FIG. 3B includes a complement generation circuit 155, a level adjusting circuit 160, a compensation circuit 170, and a phase mix circuit 175. The phase mix circuit 175 illustrated in FIG. 3B includes two buffer circuits 176, 178. The first buffer circuit 176 is configured to receive and buffer the translated complementary signal LOW-F' from the complement generation circuit 155 in the first (higher) voltage domain. Similarly, the second buffer circuit 178 is configured to receive and buffer the compensated signal LOW'-C from the compensation circuit 170 in the first (higher) voltage domain. The first and second buffer circuits 176, 178 may equivalently buffer their respective signals in some embodiments—in other words, they may equivalently drive their respective outputs responsive to their respective inputs.

The outputs of the first and second buffer circuits 176, 178 are coupled together and coupled to an output node in order to generate the output signal OUT. Coupling together of the outputs of the first and second buffer circuits 176, 178 may thus effectuate a phase mix of the outputs of the first and second buffer circuits 176, 178. As mentioned above, the first and second buffer circuits 176, 178 may equivalently drive their respective outputs, and in these embodiments, the translated complementary signal LOW-F' and the compensated signal LOW'-C may be equally weighted in the phase mixing. With reference to FIG. 3C, this equal weighting may be accomplished if inverters of equal size are used as the first and second buffer circuits 176, 178.

The level adjusting circuit 160 illustrated in FIG. 3B includes a first level translator circuit 162 and a second level translator circuit 166. The first level translator circuit 162 is coupled to the complement generation circuit 155 and to the first buffer circuit 176, and is configured to translate the complementary signal LOW-F from the complement generation circuit 155 and provide the translated complementary signal LOW-F' to the first buffer circuit 176. Similarly, the second level translator circuit 166 receives the input signal LOW, and is configured to translate the input signal LOW and provide the translated input signal LOW' to the compensation circuit 170. The boundary crossing circuit 150 in effect branches into two different paths within the second boundary—with the complement generation circuit 155, the first level translator circuit 162, and the first buffer circuit 176 together defining a first path, and the second level translator circuit 166, the compensation circuit 170 and the second buffer circuit 178 together defining a second path, with the first path being parallel to the second path.

Figure 3C:
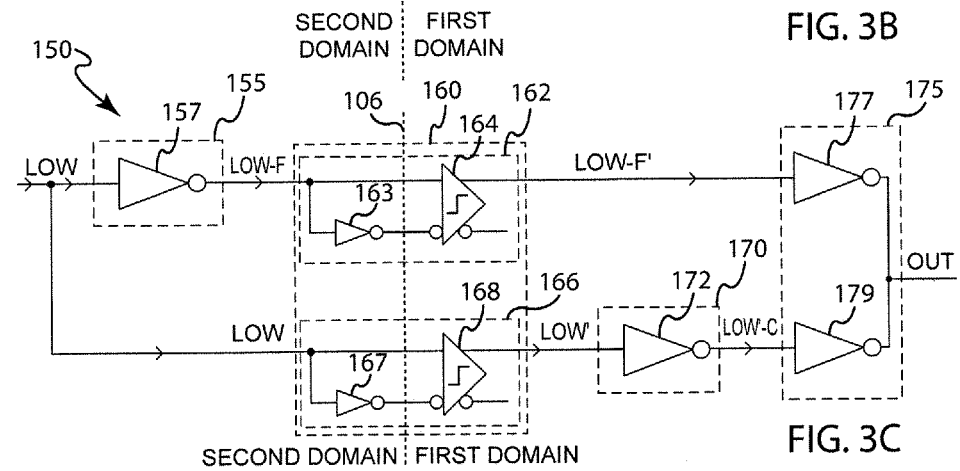
FIG. 3C is a simplified schematic diagram of a boundary crossing circuit according to an embodiment of the present invention.

FIG. 3C also illustrates an embodiment of a boundary crossing circuit 150 that may be used for the second boundary crossing circuit 150 of FIG. 1 to cross the second boundary 106 between the second and first voltage domains. Like the boundary crossing circuit 150 illustrated in FIG. 3A, and the boundary crossing circuit 150 illustrated in FIG. 3B, the boundary crossing circuit 150 illustrated in FIG. 3C includes a complement generation circuit 155, a level adjusting circuit 160, a compensation circuit 170, and a phase mix circuit 175. As illustrated in FIG. 3C, the complement generation circuit 155 may include a first inverter 157, and the compensation circuit 170 may include a second inverter 172. Even though the first inverter 157 operates in the second (lower) voltage domain and the second inverter 172 operates in the first (higher) voltage domain, the first and second inverters 157, 172 may be similarly structured in some embodiments—for example, they may be identically sized, may have the same threshold voltage, may have the same W/L ratio, and so forth. In other embodiments, however, the first and second inverters 157, 172 may be differently structured—for example, the second inverter 172 may be sized to be smaller than the first inverter 157 in order to counteract the anticipated faster response of the second inverter 172 as a result of the second inverter 172 operating in the first (higher) voltage domain as compared to the first inverter 157, which operates in the second (lower) voltage domain.

Still with reference to FIG. 3C, the phase mix circuit 175 may include a third inverter 177 coupled to the output of the first level translator circuit 162, which corresponds to the first buffer circuit 176 in FIG. 3B. The phase mix circuit 175 also may include a fourth inverter 179 coupled to the output of the compensation circuit 170, which corresponds to the second buffer circuit 178 in FIG. 3B. The third and fourth inverters 177, 179 may both operate in the first (higher) voltage domain, and may be similarly structured in some embodiments in order to equivalently buffer and phase mix the translated complementary signal LOW-F' and the compensated signal LOW'-C. For example, the third and fourth inverters 177, 179 may be identically sized, may have similar threshold voltages, and so forth.

As also illustrated in FIG. 3C, the first level translator circuit 162 may include a fifth inverter 163 and a level translator 164, and the second level translator circuit 166 may include a sixth inverter 167 and a level translator 168. Because some embodiments of the level translators 164, 168 may need complementary signals in order to translate signals into a higher voltage domain, as illustrated in FIG. 3C, inverters 163, 167 may be used to provide a complementary signal to the respective level translators 164, 168 along with the complementary signal LOW-F provided by the first inverter 157 and the input signal LOW. These fifth and sixth inverters 163, 167, in addition to the level translators 164, 168 may distort the duty cycle of the signals as they cross the second boundary 106 illustrated in FIG. 3C. However, because they may distort the duty cycle on the first/upper path equivalently but in an opposite direction of the distortion of the duty cycle on the second/lower path, the distortions may be averaged out when the translated complementary LOW-F' signal and the compensated LOW'-C signal are combined in the phase mixing circuit 175, as described above.

As illustrated in FIG. 3C, some embodiments of the second voltage boundary crossing circuit 150 may introduce only two gates worth of delay (plus the delay through the level adjusting circuit 160) into the signal path 102, thus reducing the delay through the first voltage boundary crossing circuit as compared to some other approaches. The embodiment illustrated in FIG. 3C may also consume less power and take up less area than other approaches. In other embodiments, however, more or fewer gates may be used than is illustrated in FIG. 3C—the configuration illustrated in FIG. 3C is merely one embodiment.

Figure 4:
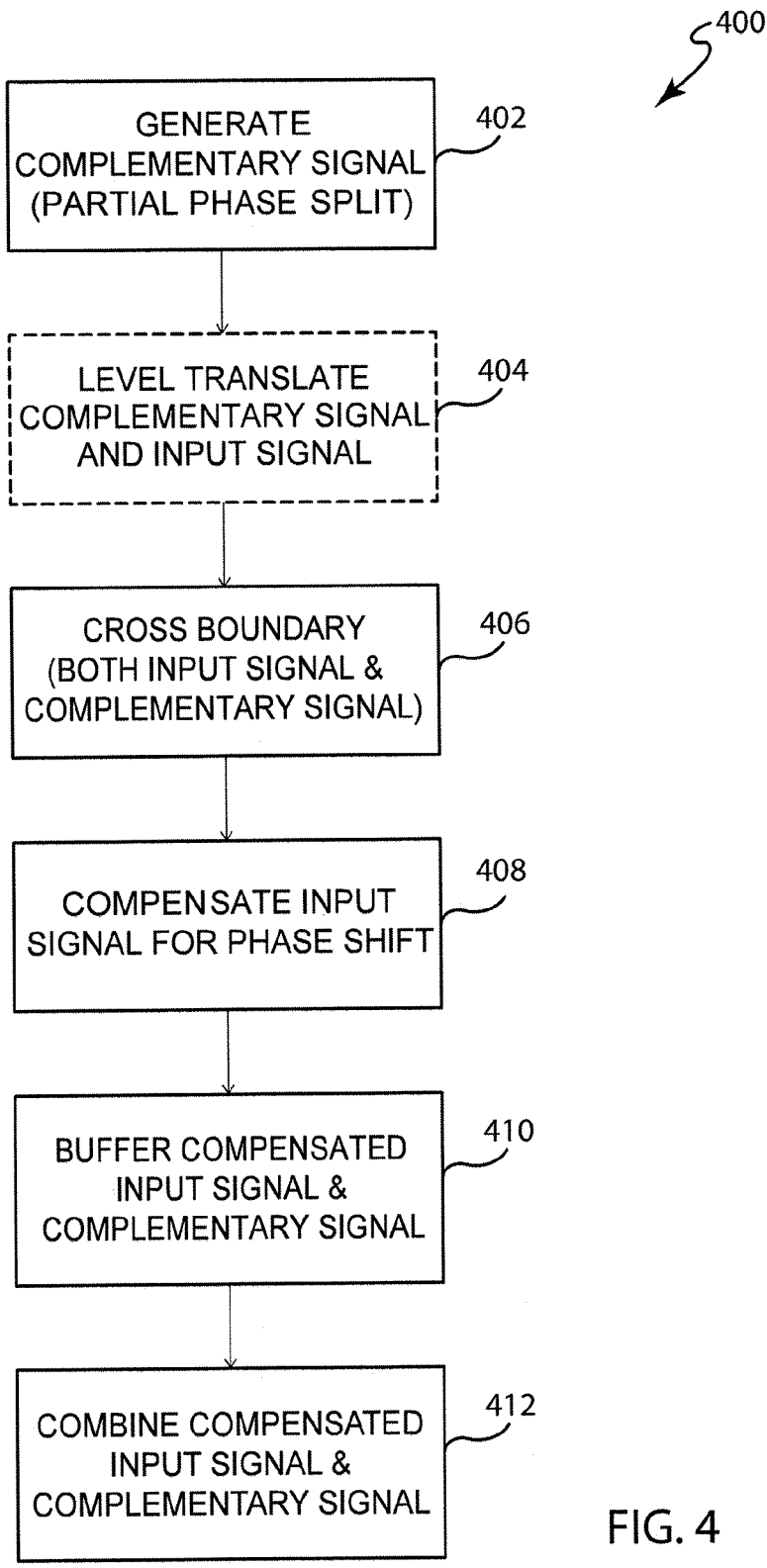
FIG. 4 is a flowchart illustrating a method for preserving duty cycle at voltage domain boundaries according to an embodiment of the present invention.

FIG. 4 illustrates a flow chart of one embodiment of preserving duty cycle at a voltage domain boundary. In operation 402, a complementary signal is generated in a first voltage domain based on a received input signal. For example, the received input signal may be inverted using a first inverter. This operation 402 may be considered to be a partial phase split, because the complementary signal is inverted from the input signal, but may have a delay (e.g., phase shift, skew) compared to the input signal. In operation 404, the complementary signal and the input signal may optionally be level translated prior to operations 406, 408, 410, and/or 412—the complementary signal and the input signal may be translated in cases where the boundary is being crossed from a lower voltage domain to a higher voltage domain.

In operation 406, both the input signal and the complementary signal may cross the voltage boundary (which may happen as part of operation 404 for crossing a boundary from a lower voltage to a higher voltage), and then in operation 408, the (possibly translated) input signal may be compensated in a second voltage domain for the delay (e.g., phase shift, skew) introduced to the input signal in operation 402. For example, the input signal may be delayed using a second inverter. In operation 410, the complementary and compensated signals are buffered, and in operation 412, the buffered complementary signal and the buffered compensated signal may be combined together in the second voltage domain. For example, third and fourth inverters may be used to phase mix the buffered complementary signal and the buffered compensated signal to generate an output signal, with both of the third and fourth inverters coupled to the output node.

Figure 5:
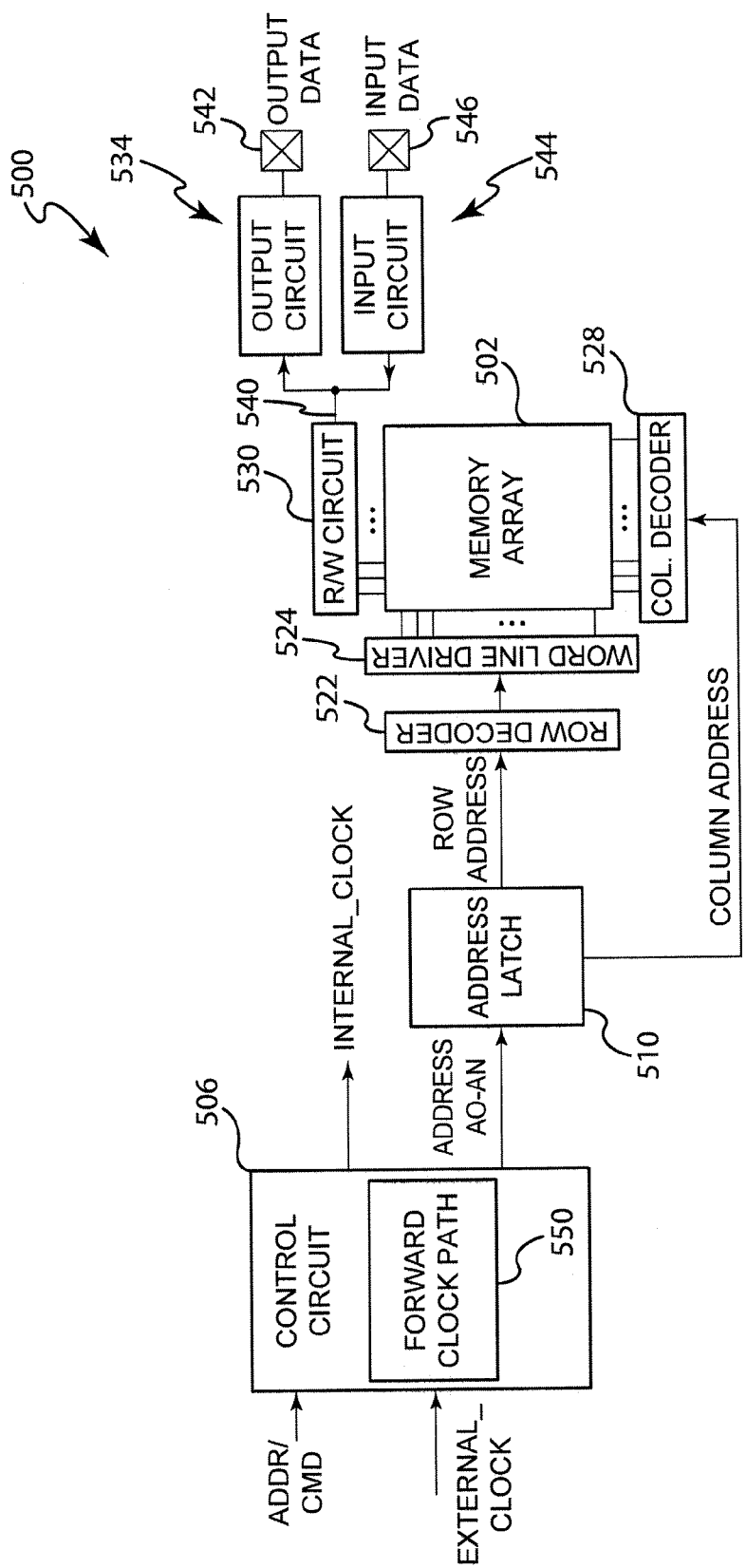
FIG. 5 is a block diagram of a memory according to an embodiment of the invention.

FIG. 5 illustrates a portion of a memory 500 according to an embodiment of the present invention. The memory 500 includes an array 502 of memory cells, which may be, for example, volatile memory cells (e.g., DRAM memory cells, SRAM memory cells), non-volatile memory cells (e.g., flash memory cells), or some other types of memory cells. The memory 500 includes a control circuit 506 that receives memory commands and addresses through an ADDR/CMD bus. The control circuit 506 provides control signals, based on the commands received through the ADDR/CMD bus. The control circuit 506 also provides row and column addresses to the memory 500 through an address bus and an address latch 510. The address latch 510 then outputs separate column addresses and separate row addresses.

The row and column addresses are provided by the address latch 510 to a row address decoder 522 and a column address decoder 528, respectively. The column address decoder 528 selects bit lines extending through the array 502 corresponding to respective column addresses. The row address decoder 522 is connected to word line driver 524 that activates respective rows of memory cells in the array 502 corresponding to received row addresses. The selected data line (e.g., a bit line or bit lines) corresponding to a received column address are coupled to a read/write circuitry 530 to provide read data to a data output circuit 534 via an input-output data bus 540. An output pad 542 coupled to the data output circuit 534 is used for electrically coupling to the memory 500. Write data are provided to the memory array 502 through a data input circuit 544 and the memory array read/write circuitry 530. An input pad 546 coupled to the data input circuit 544 is used for electrically coupling to the memory 500. The control circuit 506 responds to memory commands and addresses provided to the ADDR/CMD bus to perform various operations on the memory array 502. In particular, the control circuit 506 is used to provide internal control signals to read data from and write data to the memory array 502.

The control circuit 506 in FIG. 5 also includes a forward clock path 550 that may include, for example, the signal path 102 described herein in connection with FIG. 1 or a similar signal path. The forward clock path 550 may include two (or more) different voltage domains, and, as such, may include one or more voltage boundary crossing circuits, such as those illustrated in FIGS. 2A through 2C and FIGS. 3A through 3C.

From the foregoing it will be appreciated that, although specific embodiments of the invention have been described herein for purposes of illustration, various modifications may be made without deviating from the spirit and scope of the invention. For example, FIG. 1 illustrates an embodiment of a signal path 102, FIGS. 2A through 3C illustrate embodiments of boundary crossing circuits 110, 150, complement generation circuits 115, 155, compensation circuits 130, 170, phase mixing circuits 175, and so forth. However, other signal paths, boundary crossing circuits, complement generation circuits, compensation circuits, phase mixing circuits, and so forth may be used, which are not limited to having the same design, and may be of different designs and include circuitry different from the circuitry in the embodiments illustrated in the figures.

Accordingly, the invention is not limited to the specific embodiments of the invention described herein.

What is claimed is:

1. An apparatus, comprising:
a first complement generation circuit configured to generate a first complementary signal responsive to a first input signal, the first complement generation circuit configured to operate in a first voltage domain powered at a first voltage potential;
a first compensation circuit configured to generate a first compensated signal by compensating the first input signal for a delay corresponding to the first complement generation circuit, the first compensation circuit configured to operate in a second voltage domain powered at a second voltage potential, wherein the second voltage potential is different from the first voltage potential;
a first phase mixing circuit configured to combine the first complementary signal and the first compensated signal to generate a first output signal;
a second complement generation circuit configured to generate a second complementary signal responsive to a second input signal, the second complement generation circuit configured to operate in the second voltage domain powered at the second voltage potential;
a second compensation circuit configured to generate a second compensated signal by compensating the second input signal for a delay corresponding to the second complement generation circuit, the second compensation circuit configured to operate in the first voltage domain powered at the first voltage potential;
a second phase mixing circuit configured to combine the second complementary signal and the second compensated signal to generate a second output signal.

2. The apparatus of claim 1, wherein the first compensation circuit comprises a delay element that is configured to generate the first compensated signal by delaying the first input signal based on a delay introduced by the first complement generation circuit.

3. The apparatus of claim 1, wherein the first complement generation circuit comprises a first inverter, and the first compensation circuit comprises a second inverter.

4. The apparatus of claim 3, wherein the first and second inverters are similarly structured.

5. The apparatus of claim 3, wherein the second inverter is sized to be larger than the first inverter, the first voltage domain is powered by a first voltage source operating at the first voltage potential, the second voltage domain is powered by a second voltage source operating at the second voltage potential, and the second voltage potential is less than the first voltage potential.

6. The apparatus of claim 3, wherein the first phase mixing circuit comprises:
a third inverter coupled to an output of the first inverter; and
a fourth inverter coupled to the output of the second inverter, wherein the third and fourth inverters are similarly structured.

7. The apparatus of claim 1, wherein the first phase mixing circuit comprises a first buffer circuit configured to buffer the first complementary signal and a second buffer circuit configured to equivalently buffer the first compensated signal.

8. The apparatus of claim 7, wherein outputs of the first and second buffer circuits are coupled together and coupled to an output node, and the first phase mixing circuit is configured to phase mix the outputs of the first and second buffer circuits to combine the first complementary signal and the first compensated signal to generate an output signal.

9. The apparatus of claim 1, wherein the first complementary signal and the first compensated signal are voltage translated prior to being combined by the phase mixing circuit.

10. The apparatus of claim 1, further comprising:
a level adjusting circuit, the level adjusting circuit including a first level translator circuit configured to translate the second complementary signal from the second complement generation circuit and provide the translated second complementary signal to the second phase mixing circuit, and further including a second level translator circuit configured to translate the second input signal and provide the translated second input signal to the second compensation circuit.

11. An apparatus, comprising:
a first circuit powered by a first voltage and configured to generate a complementary signal by inverting an input signal;
a second circuit powered by a second voltage different than the first voltage and configured to generate a compensated signal by delaying the input signal;
a third circuit also powered by the second voltage and configured to generate an output signal by phase mixing the complementary signal and the compensated signal; and
a level adjusting circuit, the level adjusting circuit including a first level translator circuit configured to translate the complementary signal from the first circuit and provide the translated complementary signal to the third circuit, and further including a second level translator circuit configured to translate the input signal and provide the translated input signal to the second circuit.

12. The apparatus of claim 11, wherein the input signal and the first voltage correspond to a first voltage domain, and the output signal and the second voltage correspond to a second voltage domain.

13. The apparatus of claim 11, wherein the second circuit is configured to delay the input signal by a delay equivalent to a phase shift introduced by the first circuit.

14. The apparatus of claim 11, wherein the first circuit, the first level translator circuit, and a first buffer circuit of the third circuit together define a first path of a boundary crossing circuit, and the second level translator circuit, the second circuit, and a second buffer circuit of the third circuit together define a second path of the boundary crossing circuit, the first path of the boundary crossing circuit being parallel to the second path of the boundary crossing circuit.

15. An apparatus, comprising:
a signal path with first and second voltage domains;
a first boundary crossing circuit coupled between the first voltage domain and the second voltage domain, the first boundary crossing circuit configured to preserve duty cycle crossing between the first and second voltage domains by
inverting an input signal in the first voltage domain;
delaying the input signal in the second voltage domain; and
combining the inverted input signal and the delayed input signal in the second voltage domain; and
a second boundary crossing circuit coupled between the second voltage domain and the first voltage domain, the second boundary crossing circuit configured to preserve duty cycle crossing between the first and second voltage domains by
inverting a second input signal in the second voltage domain;
delaying the second input signal in the first voltage domain; and
combining the inverted second input signal and the delayed second input signal in the first voltage domain.

16. The apparatus of claim 15, wherein the second input signal is based on the combined inverted first input signal and delayed first input signal.

17. The apparatus of claim 15, further comprising a delay locked loop coupled between the first and second boundary crossing circuits, the delay locked loop operating in the second voltage domain.

18. The apparatus of claim 15, wherein the first boundary crossing circuit is configured to combine the inverted input signal and the delayed input signal by equally weighting the inverted input signal and the delayed input signal in a phase mix circuit.

19. The apparatus of claim 18, wherein the phase mix circuit comprises first and second inverters configured to drive the inverted input signal and the delayed input signal, respectively, onto an output node, and the first inverter is sized identically to the second inverter.

20. The apparatus of claim 15, wherein the first boundary crossing circuit is configured to only introduce two gates worth of delay into the signal path.

21. A method, comprising:
generating, in a first voltage domain, a complementary signal based on an input signal;
compensating, in a second voltage domain, the input signal for a delay incurred in generating the complementary signal, wherein the first voltage domain is powered by a first voltage source operating at a first voltage potential, the second voltage domain is powered by a second voltage source operating at a second voltage potential, and the second voltage potential is greater than the first voltage potential;
phase mixing, in the second voltage domain, the complementary signal and the compensated input signal;
level translating the input signal prior to said compensating for said delay; and
level translating the complementary signal prior to said phase mixing.

22. The method of claim 21, wherein the complementary signal and the compensated input signal are given equal weight in said phase mixing.

23. A method, comprising:
receiving a first input signal;
inverting the first input signal using a first circuit operating in a first voltage domain;

delaying the first input signal using a second circuit operating in a second voltage domain;

regulating the second voltage domain at a lower voltage potential than the first voltage domain;

combining the inverted first input signal and the delayed first input signal using a third circuit operating in the second voltage domain;

receiving a second input signal;

inverting the second input signal using a fourth circuit operating in the second voltage domain;

delaying the second input signal using a fifth circuit operating in the first voltage domain;

combining the inverted second input signal and the delayed second input signal using a sixth circuit operating in the first voltage domain.

24. The method of claim 23, wherein the first input signal is inverted using a first inverter and the first input signal is delayed using a second inverter.

25. The method of claim 24, wherein the first inverted input signal and the delayed first input signal are combined using third and fourth inverters coupled to an output node.

26. The method of claim 23, further comprising equivalently buffering the inverted first input and delayed first input signals prior to said phase mixing.

27. An apparatus, comprising:
a signal path with first and second voltage domains; and
a first boundary crossing circuit coupled between the first voltage domain and the second voltage domain, the first boundary crossing circuit configured to only introduce two gates worth of delay into the signal path, and further configured to preserve duty cycle crossing between the first and second voltage domains by
inverting an input signal in the first voltage domain;
delaying the input signal in the second voltage domain; and
combining the inverted input signal and the delayed input signal in the second voltage domain.

28. A method, comprising:
generating, in a first voltage domain, a complementary signal based on an input signal;
level translating the input signal;
compensating, in a second voltage domain, the input signal for a delay incurred in generating the complementary signal, wherein the first voltage domain is powered by a first voltage source operating at a first voltage potential, the second voltage domain is powered by a second voltage source operating at a second voltage potential, and the second voltage potential is greater than the first voltage potential;
level translating the complementary signal; and
phase mixing, in the second voltage domain, the complementary signal and the compensated input signal.

* * * * *